Jan. 26, 1965 A. FRIEDMAN 3,167,490

PRINTED CIRCUIT

Filed July 17, 1957 2 Sheets-Sheet 1

INVENTOR.

Abraham Friedman

Jan. 26, 1965 A. FRIEDMAN 3,167,490
PRINTED CIRCUIT
Filed July 17, 1957 2 Sheets-Sheet 2
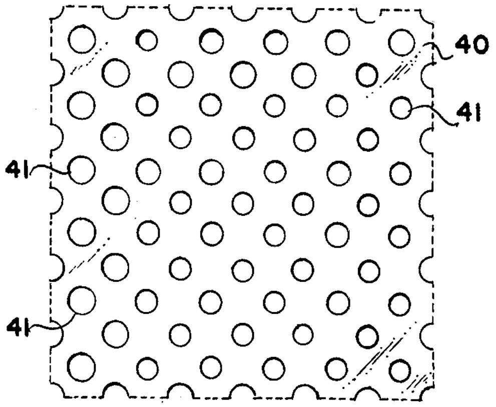
FIG. 12.
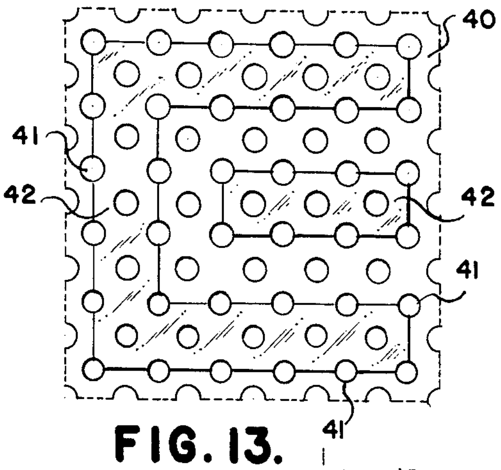
FIG. 13.
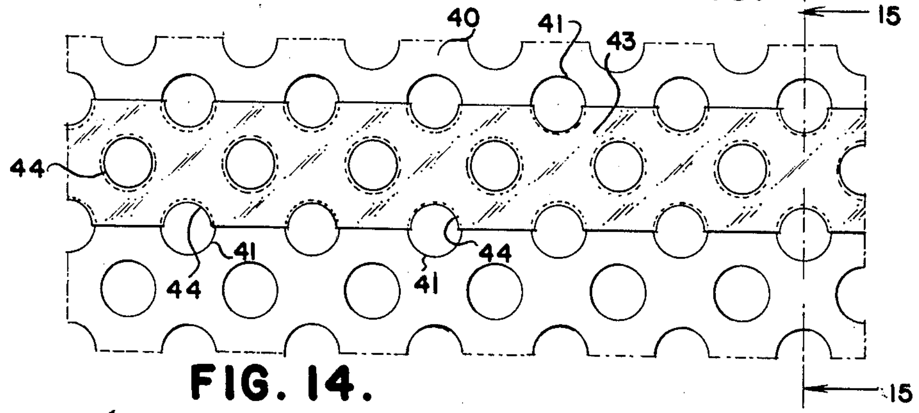
FIG. 14.
FIG. 15.
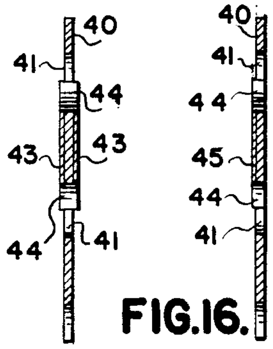
FIG. 16.
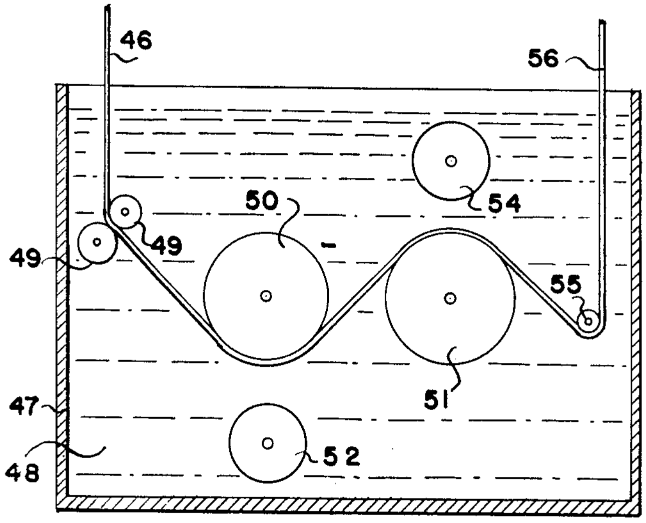
FIG. 17.
INVENTOR.
Abraham Friedman

United States Patent Office 3,167,490

Patented Jan. 26, 1965

3,167,490

PRINTED CIRCUIT

Abraham Friedman, 66 Court St., Brooklyn, N.Y.

Filed July 17, 1957, Ser. No. 672,493

3 Claims. (Cl. 204—15)

This invention relates to a printed circuit wherein a pattern of conductors is disposed upon a foraminous supporting base and to a method for forming the same.

This application is a continuation in part of my application Serial No. 658,739, filed May 13, 1957, entitled Printed Circuit and Patent No. 3,053,929, dated September 11, 1962, which eventuated therefrom.

The term "printed circuit" has been applied to a wide variety of wiring arrangements for electrical circuits which have the common characteristic of providing a pattern of electrically conductive material disposed upon some form of insulating base or support. The electrically conductive pattern serves to interconnect the variety of circuit components employed in electrical and electronic circuitry to thereby form complete circuit systems or arrangements. Numerous methods have also been suggested for the formation of such circuits in order to meet the wide variety of problems encountered in their production and application. However, none of these is deemed to be a completely satisfactory solution for the economic, mechanical and electrical problems involved.

It is, therefore, an object of this invention to provide a printed circuit and a method for forming the same, which circuit may be readily and economically produced on a large scale and possesses advantageous mechanical and electrical properties.

It is a further object of this invention to provide a printed circuit and a method for forming the same wherein an electrically conductive pattern is disposed upon a porous, apertured, reticulated or foraminous supporting element or base in a simple, efficient and economically producible manner.

Another object of this invention is to provide a printed circuit of the character indicated, wherein the electrically conductive circuit pattern extends along both sides of the supporting base element carrying it; said pattern being accessible along both of said surfaces for contact and interconnection with similar printed circuit elements in stacked or similar relation and for interconnection with other circuit components.

A still further object of this invention is to provide a printed circuit of the character indicated which by reason of its construction forms a highly efficient and well bonded support for the pattern of conductive circuit material and permits the circuit element to be further supported by impregnation, lamination, or encapsulation with other materials or upon additional supporting elements, in a highly efficient manner.

It is also an object of this invention to provide a printed circuit element of the character indicated which is capable of being assembled in interleaved relation with similar circuit elements or with other circuit components all of which may be readily united into a solid cohesive mass as by impregnation, encapsulation or potting and which is adapted to provide three-dimensional circuit pattern arrangements including cross-overs.

A still further object of this invention is to provide a printed circuit element which may be formed by a convenient method, using a variety of materials and wherein the conductive pattern or the foraminous support therefor may be further covered, coated or otherwise treated in accordance with the requirements of the particular application.

An additional object of this invention is to provide a method for the formation of printed circuits upon a supporting material in a continuous manner.

Other and further objects, benefits and advantages of this invention will become apparent from the description thereof contained in the annexed drawings, specifications and claims or will otherwise become obvious.

In the accompanying drawings, wherein some parts have been somewhat exaggerated for purpose of clarity:

FIGURE 12 is a plan view of another form of base material;

FIGURE 13 is a plan view of a sheet of base material shown in FIGURE 12 to which the desired printed circuit pattern has been preliminarily applied in the form of a conductive ink or similar material;

FIGURE 14 is a fragmentary view on an enlarged scale of the printed circuit formed on the base sheet of FIGURE 13 after the printed circuit material has been electro-deposited thereon;

FIGURE 15 is a cross section of FIGURE 14 taken along line 15—15 thereof;

FIGURE 16 is a cross section of a portion of an additional form of printed circuit; and FIGURE 17 is a schematic view of a plating arrangement for the continuous deposition of the conductive printed circuit material upon a base support sheet.

Figure 1:
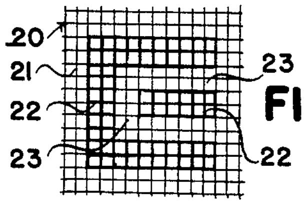
FIGURE 1 is a plan view of a printed circuit in accordance with the present invention.
Figure 8:
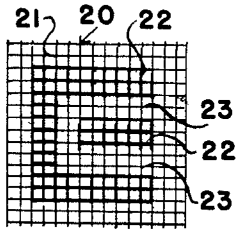
FIGURE 8 is a plan view of the printed circuit after the printed circuit pattern has been electro-deposited thereon.
Figure 9:
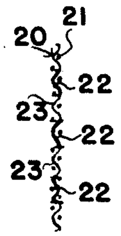
FIGURE 9 is a cross section of the printed circuit shown in FIGURE 8.

FIGURES 1, 8 and 9 illustrate a printed circuit in accordance with the present invention. The printed circuit is designated generally by the numeral 20 and comprises an insulating support or base 21 upon portions of which there are disposed the electrically conductive areas or conductors 22. These conductive areas are formed of a suitable electrically conductive material such as for example metallic copper. Other suitable electrically conductive materials may be employed. The particular configuration of the conductive areas or conductors shown is for illustrative purposes only, and it will of course be understood that the conductors may be of any number and arranged in any desired configuration or pattern in accordance with the requirements of the particular circuit arrangement in connection with which it is being employed. The insulating base 21 is comprised of an apertured, foraminous, reticulated or porous sheet material. In the form of the invention illustrated in the foregoing figures the foraminous material employed as an insulating base comprises a woven open mesh fabric. It will, however, be understood that other forms of apertured, foraminous, reticulated or porous sheet materials may be employed. These support materials may constitute woven or unwoven fabrics as for example, mats formed of fibers, strands or filaments, porous sheet material, or they may constitute sheet material of paper, plastic, glass, ceramic, etc., through which perforations or apertures have been mechanically or otherwise formed. For convenience of expression, the term "formaminous" will be used to include these materials as well as others having similar suitable characteristics.

The base sheet 21 constitutes a support for the conductors and an electrical insulator and is therefore formed of a substance having this characteristic. For this purpose the sheet may be formed of natural or synthetic fibers or filaments, or of a homogeneous sheet of such materials which has been mechanically or otherwise apertured or perforated or is otherwise of a foraminous nature. In connection with such perforated sheets the bridging portions correspond to the fibers, strands or filaments of a woven or matted sheet material. A particularly useful material for the insulating base sheet 21 comprises glass fibers, filaments or strands which have highly desirable electrical, chemical and mechanical characteristics in connection with many applications.

As may be seen particularly in FIGURE 9, the conductive material is disposed upon the threads, strands or filaments which comprise the insulating base and thus form the electrically conductive areas or conductors 22 thereon. The conductive areas are insulated from each other by the intervening portions 23 of filaments upon which no deposit of conductive material has been made. The conductive material advantageously extends around and completely encompasses the strands forming the fabric material and is consequently mechanically locked upon them and is thus exposed along both of the surfaces of the base sheet. This arrangement permits electrical connections to circuit components or similar circuit elements to be made along either or both surfaces of the conductors. The arrangement therefore permits the stacking of similarly formed printed circuits and their interconnection at suitable points thus resulting in three-dimensional circuit arrangements.

The printed circuit comprising the present invention is advantageously produced by the method which will now be described and which is illustrated in FIGURES 2–7 of the drawings. In the employment of this method, a printed circuit such as that illustrated in FIGURES 1, 8 and 9 is produced by the electro-deposition of a metal such as copper on the mesh of the foraminous supporting base in accordance with the desired pattern. In using the term "mesh," it is intended to refer to the solid material such as the threads, strands, filaments or fibers or in the case of other forms of sheet material the bridging portions thereof which define and enclose the openings, apertures, spaces, or pores therebetween. It should be noted that it is characteristic of a printed cricuit pattern that a plurality of conductors are provided and arranged in accordance with a predetermined pattern which conductors are insulated from each other and form isolated and discrete conductive areas. By reason of this physical characteristic of a printed circuit, considerable difficulty has heretofore been encountered in the formation of such circuit upon an insulating base particularly by electro-plating methods since cathode connections are required for each of the isolated areas during the plating operation.

In its broad outlines, the instant method for the formation of a printed circuit comprises the steps of applying a preliminary electro-conductive material such as for example conductive ink, powder, paint, or metallic layer to the base sheet in accordance with the desired printed circuit pattern, contacting said conductively patterned base sheet with an overall cathode electrode support and electro-depositing the desired conductive material such as copper or other suitable metal upon the inked portions pattern to provide the desired electrical and mechanical characteristics.

Figure 2:
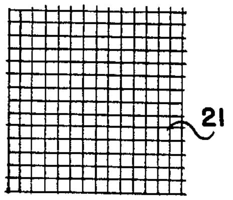
FIGURE 2 is a plan view of a sheet of foraminous base or support material prior to the formation of a printed circuit thereon.
Figure 3:
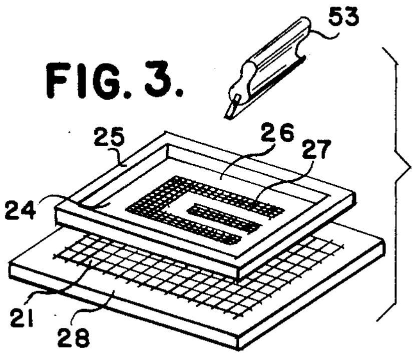
FIGURE 3 is a schematic view of one method of applying a conductive material to the base in accordance with the desired printed circuit pattern.

Referring more particularly to the invention, FIGURE 2 illustrates a sheet of woven fabric such as, for example, a sheet of glass fabric which is to serve as the insulating support or base 21 for the printed circuit. A preliminary deposit of electro-conductive material is then disposed upon the supporting base 21. The preliminary deposit of the conductive pattern may be accomplished by numerous methods well known in the graphic arts. FIGURE 3 illustrates one method by means of which such deposit may be accomplished utilizing the silk screen process. In this method a screen of silk or similar material 24 is stretched upon a frame 25 and the areas in which no preliminary deposit is desired are blocked out and made impenetrable as shown at 26 while the areas through which the deposit is desired corresponding to the conductors of the printed circuit are left open for free penetration by the printing medium as shown at 27. The insulating base material 21 upon which the deposit is to be made is positioned below the screen and is supported upon a suitable back board 28. The screen is then lowered into contact with the base material 21 and a suitable electro-conductive ink, or similar material is poured into the frame on the upper surface of the screen. The sequeegee 53 is then drawn across the upper surface of the screen forcing the paint through unobstructed interstices thereof thus resulting in a deposit of the ink upon the sheet 21 in accordance with the desired printed circuit pattern. This printing method is well known in the graphic arts. Numerous materials are available for the purpose of making this preliminary conductive deposit. Thus, a conductive silver paint or ink may be used for this purpose. Dispersions of graphite in a suitable carrier such as, for example, a dispersion of graphite in water may well be used. Similarly dispersions of other metals are available for this purpose. An additional method for applying the preliminary conductive pattern is to imprint the desired pattern upon the base sheet by means of a varnish or lacquer. The sheet is then dusted with a powder material such as copper, silver or graphite. The desired conductive pattern is achieved since the powder material adheres to the imprinted areas only. The preliminary conductive pattern may also be disposed upon the insulating base sheets by other known graphic arts methods, thus an open stencil may be used and the pattern may be brushed, sprayed or squeegeed through the stencil. The pattern may be imprinted upon the base sheets by means of printing plates of rubber or other materials. Silver may also be deposited by the reduction of a silver salt as is well known in the printed circuit art. It has been found advantageous to deposit the preliminary conductive pattern so that the conductive material encompasses the mesh or bridging portions of the base support within the desired conductive areas. This may be accomplished in connection with certain materials by a single imprint of the preliminary conductive material wherein it flows around and encompasses the mesh material. Where a single impression is inadequate to completely encompass the mesh portions of the base material and such complete encompassment is desired the preliminary conductive pattern may be disposed upon the supporting base by imprinting it on both sides, either simultaneously or in successive steps. Thus, after having screened one side of supporting base 21, the same pattern is applied to the opposing surfaces of the support by means of a reversed screen in registration with the pattern already deposited. Both sides of the support may also be simultaneously patterned by using a suitable double screen arrangement. Similar considerations apply where other graphic art methods are used for depositing the initial or preliminary conductive pattern upon the base support in such manner that the mesh material is completely encompassed by the conductive ink or substance. Thus, for example, the pattern may be applied by passing the support sheet between a pair of printing rollers, particularly of rubber, which bear the desired pattern, or the conductive ink or material may be sprayed upon the supporting base through stencils disposed upon one or both sides thereof. Although it is particularly advantageous that the mesh material falling within the desired conductive areas be completely encompassed by the preliminary deposit of conductive material, many of the features of this invention may be realized without such complete coverage.

Figure 4:
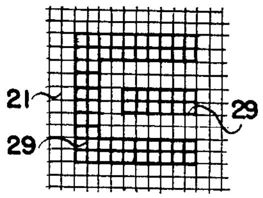
FIGURE 4 is a plan view of the sheet of base material to which a conductive material has been applied in accordance with the desired printed circuit pattern as by the method shown in FIGURE 3.

FIGURE 4 illustrates the base support 21 to which a preliminary deposit of conductive material 29 has been applied in accordance with a desired printed circuit pattern. The insulating base bearing the preliminary conductive pattern may be utilized without further addition of conductive material to the conductive areas in connection with some applications. Thus, for example, a deposit of a conductive silver ink upon the foraminous base may provide adequate conductivity for some purposes. In order to improve the conductivity of such ink it may be applied to a suitable high temperature glass fabric which is then baked to permit the silver to flux and thereby improve the conductivity and physical characteristics of the desired conductive regions. Although many of the advantages of the use of a foraminous base support may thus be realized, a wider application of this printed circuit and a more full realization of the benefits thereof is achieved by the additional deposition of conductive material upon the preliminary conductive pattern.

Figure 5:
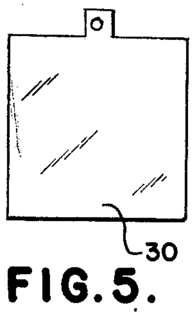
FIGURE 5 is a plan view of a supporting cathode electrode.
Figure 6:
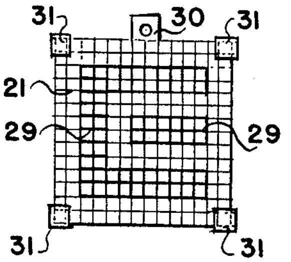
FIGURE 6 is a plan view of the supporting cathode electrode with the conductive pattern imprinted base sheet shown in FIGURE 4 mounted thereon.
Figure 7:
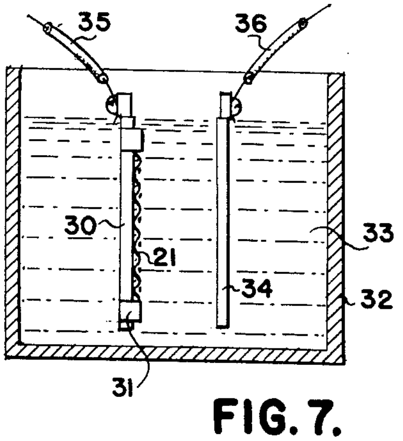
FIGURE 7 is a cross-section of a plating tank arrangement for the electrode-deposition of conductive material upon the base sheet.

FIGURES 5, 6 and 7 illustrate a method whereby a metal such as copper is electro-deposited upon the preliminary pattern to impart thereto the additionally desired physical and electrical characteristics. FIGURE 5 illustrates one form of cathode support electrode by means of which such electro-deposition is achieved. Cathode support electrode 30 comprises a sheet of metal, such as copper having surface areas co-extensive with the boundaries of the desired printed circuit pattern. As shown in FIGURE 6, the base sheet 21 bearing the preliminary deposit of conductive material 29 is placed in surface contact with cathode electrode 30 and retained in position by means of suitable clips 31 or similar securing means. The preliminarily patterned sheet 21 is disposed upon the cathode electrode 30 so that the preliminary conductive material which has been deposited thereon contacts the cathode electrode surface. The cathode electrode may also be formed of a foraminous sheet such as a perforated metal or woven wire cloth or screen, the mesh of which is sufficiently closely spaced so that contact will occur between some portion of the mesh thereof and each of the isolated conductive areas. The physical configuration of the cathode support electrode 30 may also be otherwise varied so that said electrode may be curved, cylindrical or otherwise suitably shaped. The assembly comprising the cathode electrode and the base support is then introduced into a plating tank 32 containing the plating solution 33. The plating solution may be of standard formulation as is well known in the plating art depending upon the type of metal to be deposited. In the case of a copper deposit, a suitable plating solution and conditions for its use is given in the table below:

*Acid copper bath*

| | N | G./l. | Avoir., oz./gal. | Fluid, oz./gal. |
|---|---|---|---|---|
| Copper sulfate, $CuSO_45H_2O$ | 2 | 250 | 33 | ---------- |
| Sulfuric acid, $H_2SO_4$ | 1.5 | 75 | 10 | 6 |
| Temperature, 20 to 50° C. (68 to 122° F.) | | | | |
| Current density, 2 to 10 amp./dm.$^2$ (20 to 100 amp./ft.$^2$). | | | | |

Fluoborate or cyanide copper plating baths may also be employed. The plating tank, of course, has also disposed therein a suitable anode electrode 34 such as of copper and both the anode electrode and cathode electrode assembly are connected to a suitable source of current by means of conductors 35 and 36. The plating solution penetrates through the foramens of the insulating support. As the plating action proceeds, a layer of copper is electrode-deposited upon the preliminary conductive printed circuit pattern in accordance with the configuration thereof. Such deposit occurs initially at the point of contact between the preliminarily conductively coated surfaces of the insulating base and the cathode electrode and covers the mesh of the base support to the degree that it has been covered by the preliminary deposit of conductive material. Thus, where the preliminary conductive coating completely encompasses the mesh of the insulating base, the copper deposit similarly encompasses the mesh and forms a firm mechanical bond therewith.

In order to facilitate the plating action, the plating solution may be agitated or a stream thereof directed at the face of the insulating base material mounted upon the cathode to thereby increase the circulation of the plating solution in this region and to force the foraminous material into more intimate contact with the cathode for better electrical contact therewith. Furthermore, the use of a foraminous cathode electrode serves to give additional access of the plating solution at the contacting surfaces. The completed printed circuit as removed from the cathode support electrode is illustrated in FIGURES 8 and 9 which show the electro-deposited copper disposed upon and surrounding the cloth mesh to form the conductive areas or conductors 22.

Figure 10:
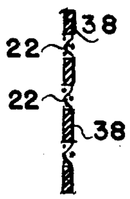
FIGURE 10 is a cross section of the printed circuit similar to FIGURE 9, the interstices of which have been impregnated with an insulating material.
Figure 11:
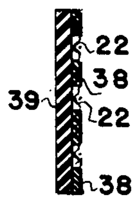
FIGURE 11 is a cross section showing the printed circuit laminated to a supporting panel.

Although the printed circuit may be utilized in this form, it is often desirable to impart additional rigidity and other desirable physical and electrical characteristics thereto by impregnating the entire insulating base sheet with an insulating material, such as for example, an epoxy or phenolic resin as shown in FIGURE 10 at 38. This impregnation may if desired be limited to the insulating areas of the circuit. Under circumstances where electrical access to the conductors 22 is desired from one side of the printed circuit only, the circuit may additionally be mounted upon a backing board 39 such as is illustrated in FIGURE 11 or in the alterative, the printed circuit in the form shown in FIGURES 8 and 9 may be pressed into a resin impregnated sheet so as to be flush with the surface thereof. These methods of mounting the printed circuit comprising the present invention are referred to by way of example only to indicate the wide variety of methods whereby the circuit may be utilized, it will be understood that said circuit may be mounted or otherwise treated in numerous ways. The accessibility of the conductors from either side of the support makes it possible to stack a number of these circuits and to interconnect them by surface of solder contact at selected points. Furthermore, cross-overs between different circuit layers may be readily formed by the interposition of insulating sheets between successive layers of printed circuit elements. Interconnection between the layers at any desired point is accomplished by providing a small conductive area on the intermediate insulating sheet at the desired point of interconnection formed in the manner hereinabove described. Furthermore, various types of circuit components such as disc type capacitors or resistors may be interposed between circuit layers. A stack of such printed circuit elements may be readily potted or encapsulated as a unit.

FIGURES 12, 13, 14, 15 and 16 illustrate a form of the invention wherein a sheet of homogeneous insulating material is utilized as an insulating base. Thus the sheet 40 illustrated in FIGURE 12 may be formed of any suitable insulating material such as plastic, paper, glass, etc. of single ply or laminated structure. The perforations 41 are formed in the sheet material mechanically or by any other suitable means and the bridges between said perforations correspond to the mesh portion of the fabric heretofore described. The perforated insulating base sheet 40 is processed in the manner similar to that heretofore described. Thus, as shown in FIGURE 13, a preliminary deposit of a conductive material such as an ink or paint is disposed upon the insulating base 40 in accordance with the desired printed pattern as shown at 42. It is preferred that the deposit enter the interstices or perforations and cover the walls thereof within the conductive areas of the pattern configuration and that the conductive material be disposed on both surfaces thereof so that electrical continuity is established between both surfaces of the insulating base through the preliminary deposit upon the walls of the perforations. The imprint or deposit of preliminary conductive material may be made by means of any of the methods heretofore described, such as silk screening, stencilling, spraying or printing it upon the base 40 or such deposit may be made by manually painting the pattern upon an insulating base by means of a brush. The insulating base bearing the preliminary conductive deposit pattern is then mounted upon a cathode electrode in the manner heretofore described and an electro-deposit of copper or other conductive material is then formed thereon. The foramens permit the plating action to proceed along both surfaces. An enlarged fragment of the resultant printed circuit is shown in FIGURES 14 and 15 which illustrate the manner in which the conductors 43 are formed on both surfaces of the supporting base and extend through the perforations thereof along the walls of said perforations as shown at 44. It is apparent from the foregoing that a printed circuit of this character is completely mechanically bonded to the insulating support or base material since it surrounds and encompasses said material. It is, of course, possible to limit the deposition of the copper conductive areas 45 to one surface of the insulating base as illustrated in FIGURE 16; this being accomplished by limiting the deposit of the preliminary conductive material to said surface.

The use of a perforated sheet of this character is particularly advantageous for the formation of printed circuits upon such materials as paper, which, when the circuit has been formed thereon may then be laminated or adhered to a more rigid support. When the conductors encompass both sides of the paper, it will be apparent that the unexposed surface of the printed circuit will be well protected from corrosion, abrasion or peeling. The use of a formaminous sheet not only permits the penetration of the plating solution but also facilitates the adhesion, lamination, or incorporation of the printed circuit in a supporting body since it permits the laminating adhesive or resin or other material to enter the foramens and thus produce a more firm bond. Furthermore, when it is desired to stack a number of these printed circuits, the entire group may be more readily encapsulated since the foramens permit a more complete penetration of the potting or encapsulating resin or material.

The insulating base of the type shown in FIGURE 12 may also, if desired, the formed of a rigid panel or board such as, for example, a board formed of laminations of phenolic impregnated sheets of paper which is commonly used in the printed circuit art. When such rigid insulating support sheet is used, a modified form of cathode electrode arrangement is advantageously employed. The cathode electrode under such circumstances is advantageously formed of a flexible sheet such as, for example, woven copper cloth or it may be formed of a sheet of glass fabric, the mesh of which has been rendered conductive as by an overall coating of graphite or similar conductive material. The use of a flexible cathode electrode assures more complete electrical contact between isolated conductive areas on the rigid insulating base material and the cathode electrode. Additionally, the use of a foraminous material for the cathode electrode permits a more complete access of the plating solution to the surface areas upon which the electro-deposit is to be made. The foraminous cathode electrode is advantageously positioned in confronting relation with the anode in the plating bath.

The use of a foraminous electrode also permits the electrodeposition of a printed circuit upon solid or imperforate base materials by depositing a preliminary conductive pattern on the surface of said sheet and positioning said electrode on said face. The foraminous electrode permits access of the plating solution to the face of the base material and also provides the cathodic electrical contact therefor. A flexible cathode electrode provides the additional advantages indicated above. It should be noted that during the plating action of the printed circuit herein described, a deposit is simultaneously formed upon the cathode plate. This material is readily recovered since the cathode plate may then be used as an anode in the next plating operation. In this manner, the waste of metallic copper is reduced to a minimum, if not entirely eliminated.

FIGURE 17 illustrates schematically a method for the continuous electro-deposition of the conductors upon an insulating base. In this arrangement a continuous strip 46 of insulating base material upon which a preliminary conductive deposit has been made in accordance with the desired pattern as heretofore described is utilized. The pattern is repeated on the insulating base material at spaced intervals. This preliminary imprint may, for example, be accomplished by continuous printing methods, such as for example, passing the strip of insulating base material between a pair of suitable inked rubber printing rollers bearing the desired circuit pattern. The strip of base material 46 is fed into plating tank 47 containing a suitable plating electrolyte 48 between rollers 49. The plating tank additionally includes cathode electrodes in the form of rotatable cylinders 50 and 51 which are provided with suitable electrical connections not shown and form the cathode electrode supports in the plating process. The anodes 52 and 54 of the plating arrangement may be of any suitable form it having been found advantageous to form such anodes in cylindrical form similar to the cathodes. The strip of insulating base material 45 is advantageously passed under cathode cylinder 50 and over cathode cylinder 51 and then passed under idler roller 55 after which it emerges from the plating tank. The end 56 of the strip is, of course, provided with a suitable take-off arrangement not shown which draws the strip through the tank and maintains it in firm contact with the cathode cylinders. Although a single cathode cylinder is useful it will be apparent that by means of this arrangement both sides of the insulating base strip are brought into contact with the surface of a cathode cylinder and direct electrical contact is made with more of the area upon which the preliminary conductive pattern has been disposed, thus, causing an electro-deposit to be formed more readily upon the printed circuit pattern areas. The number of cathode cylinders may be further increased. When anodes in cylinder form are employed, it may be possible to interchange the cathode and anode cylinders after a substantial deposit of metal has been made upon the cathode cylinders thus introducing economy into the operation. The cathode cylinders may be solid or they may be hollow and formed with foramens such as by the use of perforated sheet material or wire screening or cloth. The use of an apertured cylinder makes possible an increase in circulation of the plating solution at both surfaces of the insulating base. Furthermore, if desired, a stream of plating solution may be directed against the insulating support material so as to increase the circulation of the solution and force the base material into more intimate contact with the cathode cylinder. A still further form of handling the plating solution is to utilize a foraminous cathode cylinder and to withdraw the plating solution from the interior of the cylinder and cause it to recirculate into the plating tank as by means of a pump. This constant circulation of the plating solution through the foramens of the cylinder and base material results in the constant replacement of depleted solution in the plating region and also forces the insulating base material into more intimate contact with the cylinder wall to thus assure electrical continuity between the cylinder wall and the conductive areas of the printed circuit pattern.

I have here shown and described preferred embodiments of my invention. It will be apparent, however, that this invention is not limited to this embodiment, and that many changes, additions and modifications can be made in connection therewith without departing from the spirit and scope of the invention as herein disclosed and hereafter claimed.

I claim:

1. The method of forming a printed circuit which comprises depositing a preliminary coating of electro-conductive material about the mesh portions only of a foraminous insulating base material in accordance with a desired printed circuit pattern, retaining said base material against the surface of the cathode electrode of an electro-plating arrangement so that at least some portion of each of the conductive areas of said printed circuit pattern contacts said electrode and electrolytically depositing a metal upon the preliminarily coated portions of said mesh and interconnecting said metal portions with electrical circuit elements.

2. The method of continuously forming a printed circuit which comprises forming a preliminary surface deposit of electro-conductive material about the mesh only of a strip of foraminous insulating material in accordance with a desired printed circuit pattern, said pattern comprising discrete conductive and non-conductive areas, repeating said pattern at spaced intervals along said strip and passing said strip through a plating bath while retaining preliminary conductive surface in contact with a cathode electrode disposed within said bath to thereby form a layer of foraminous electro-deposited metal on said preliminary conductive deposit.

3. The method according to claim 2 wherein portions of said electro-deposited metal are interconnected with electrical circuit components.

References Cited in the file of this patent

UNITED STATES PATENTS

| | | |
|---|---|---|
| 707,306 | Daly | Aug. 19, 1902 |
| 2,042,030 | Tainton | May 26, 1936 |
| 2,582,685 | Eisler | Jan. 15, 1952 |
| 2,884,571 | Hannahs | Apr. 28, 1959 |

FOREIGN PATENTS

| | | |
|---|---|---|
| 19,919 | Great Britain | of 1892 |
| 9,982 | Great Britain | of 1843 |

OTHER REFERENCES

Plating, July 1953, "A Flexible Plated Circuit," Bowerman et al., page 765–766.